United States Patent [19]

Thal, Jr.

[11] 4,437,073

[45] Mar. 13, 1984

[54] EQUALIZER CAVITY WITH INDEPENDENT AMPLITUDE CONTROL

[75] Inventor: Herbert L. Thal, Jr., Tredyffrin Township, Chester County, Pa.

[73] Assignee: The United States of America as represented by the Secretary of the Air Force, Washington, D.C.

[21] Appl. No.: 347,384

[22] Filed: Feb. 9, 1982

[51] Int. Cl.$^{3}$ .......................... H01P 5/00; H03H 7/03

[52] U.S. Cl. .................................. 333/28 R; 333/227; 333/230

[58] Field of Search .................... 333/28 R, 22 R, 211, 333/227, 230, 232, 18, 212

[56] References Cited

U.S. PATENT DOCUMENTS

| | | | |
|---|---|---|---|
| 2,473,448 | 6/1949 | Rieke | 333/28 R X |
| 3,277,403 | 10/1966 | Cohn | 333/28 |
| 3,466,573 | 9/1969 | Abele et al. | 333/28 R |

FOREIGN PATENT DOCUMENTS

| | | | |
|---|---|---|---|
| 55-35579 | 3/1980 | Japan | 333/28 R |

OTHER PUBLICATIONS

Thomas A. Abele and Han-Chiu Wang, "An Adjustable Narrow Band Microwave Delay Equalizer", IEEE Transactions on MTT (Microwave Theory and Techniques) vol. MTT-15, No. 10, Oct. 1967, pp. 566-574.

*Primary Examiner*—Paul L. Gensler
*Assistant Examiner*—Benny Lee
*Attorney, Agent, or Firm*—Donald J. Singer; William Stepanishen

[57] ABSTRACT

An equalizer cavity apparatus which is directionally coupled to a rectangular waveguide utilizes a circular waveguide with an adjustable RF absorber therein to lower the quality factor, Q, of the equalizer cavity.

6 Claims, 2 Drawing Figures

EQUALIZER CAVITY WITH INDEPENDENT AMPLITUDE CONTROL

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to an electromagnetic waveguide network, and in particular to an equalizer cavity apparatus with independent amplitude control.

Distortion, such as phase or delay, deteriorates the performance of communications systems. A common method of improving the performance of a communication system is to compensate for the delay over the narrow band of the system i-f chain with an equalizer unit. For example, if the system must operate anywhere within a broad shf band, such as the military satellite band, then the equalizer unit must be readjusted in the i-f channel every time the carrier frequency is moved appreciably. The group delay varies over the shf band due to the predictable behavior of the various band pass and band reject filters in the transmit or receive chains of the system. A fixed equalizer unit can be designed once and for all to compensate these delay variations over the whole shf band and then the i-f equalizer need not be readjusted each time the carrier frequency is changed. The system now has frequency agility.

A dual mode resonator coupled to a waveguide and connected to a microwave network can equalize typical distortion in the shape of the time delay vs. frequency characteristic of electromagnetic wave energy traveling through the network. However, it is necessary for the proper response of the dual mode resonator that the two modes of the cavity are at the same resonant frequency. It is also necessary that the two modes of the cavity are of equal amplitude and in phase quadrature with each other in order to introduce a transmission coefficient that complements the time delay vs. frequency characteristic of the network, and thereby does not introduce any mismatch.

As simple and as useful as such a component appears to be, it has been found in practice that it is impossible to precisely estimate in advance the time delay vs. frequency characteristic to be equalized and then to specifically design a cavity and its coupling mechanism to provide this characteristic. In other words some adjustment of each equalizier for each application is essential. This requires a continuous adjustability of the loaded Q of the cavity without introducing losses due to reflections at the aperture. No method or apparatus suitable for this purpose is presently known in the art.

There are system components which produce group delays that are not predictable. These system components include waveguide transmission lines whose exact lengths may be unknown until installation; also high powered amplifier tubes, parametric or tunnel diode amplifiers, and similar components may be included in the unknown, unpredictable category. If the system is to change carrier frequency without the need for re-equalization, then the sum of the delays contributed by these components must be carefully measured in the system installation. A variable equalizer would be required as part of such a system. The equalizer unit would be required to provide a wide range of delay shapes, with adjustability to flatten the delay over the entire band.

SUMMARY OF THE INVENTION

The present invention utilizes a circular waveguide that is connected to the top of an equalizer cavity which is directionally coupled to a rectangular waveguide. A small aperture is provided between the equalizer cavity and the circular waveguide. The aperture allows some of the energy that is stored in the equalizer cavity to enter the circular waveguide. An adjustable absorber which is positioned at the end of the circular waveguide, absorbs some of this energy and, thus, lowers the Q (quality factor) of the cavity. The amount of the absorbed energy depends primarily on the location of the absorber, and also on the diameters of the circular waveguide and the aperture, rather than the properties of the absorber.

It is one object of the present invention, therefore, to provide an improved equalizer cavity apparatus.

It is another object of the invention to provide an improved equalizer cavity apparatus with independent amplitude control.

It is a further object of the apparatus wherein the independent amplitude control provides a minimum interaction with the delay response.

It is yet another object of the apparatus wherein a microwave energy absorber is utilized to provide the amplitude control.

It is another object of the apparatus wherein the location of an absorber primarily determines the amount of amplitude control.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
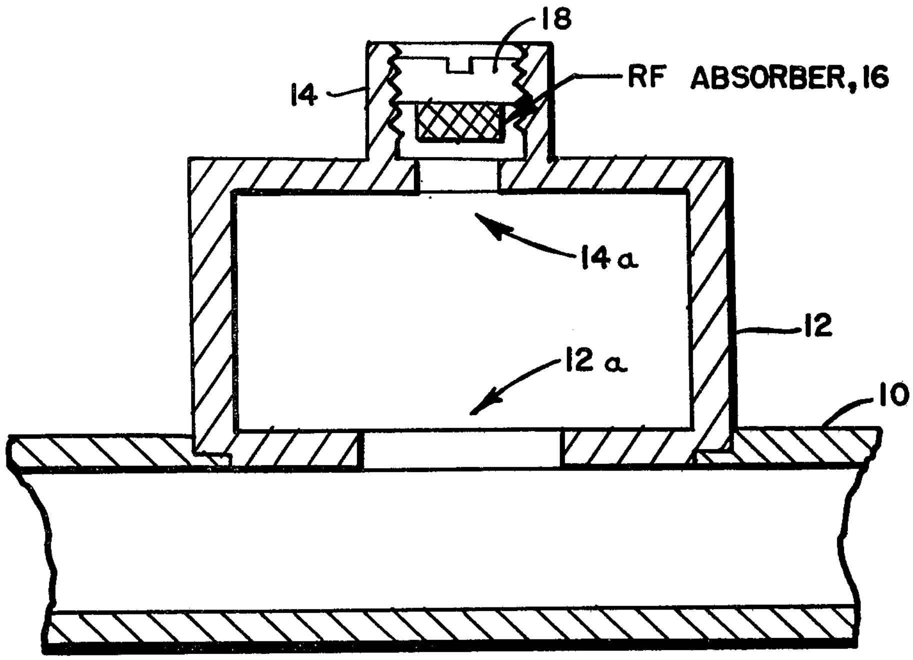
FIG. 1 is a cross sectional view of the equalizer cavity apparatus according to the present invention, and, FIG. 2 is a graphical representation of performance characteristics which comprise group delay, insertion loss change, and frequency change, all versus the amount of penetration of the absorber.

Referring now to FIG. 1, there is shown an equalizer cavity apparatus which is a rectangular waveguide 10, an equalizer cavity 12, and a circular waveguide 14. The rectangular waveguide 10 is a conventional rectangular waveguide component that has an equalizer cavity 12 mounted on the top surface thereof. The equalizer cavity 12 may be attached to the rectangular waveguide 10 by any suitable conventional means. The equalizer cavity 12 contains an opening **12*a* in its lower wall which allows a predetermined amount of electromagnetic radiation that is present in the rectangular waveguide 10 to enter the equalizer cavity 12. The equalizer cavity 12** is a variable unloaded Q equalizer stage. The adjustment of the unloaded Q (QO) has essentially no effect on the resonant frequency or external Q (Qu) of the equalizer stage so that amplitude control may be achieved independent of group delay.

The device operates in the following manner. A cutoff circular waveguide 14 is mounted by any suitable conventional means to the top of an equalizer cavity 12 which is directionally coupled to a rectangular waveguide. A small aperture 14a is opened between the equalizer cavity 12 and the circular waveguide 14 to allow some of the electromagnetic energy that is stored in the equalizer cavity 12 to enter the circular waveguide 14. Since the circular waveguide 14 is cut off, the strength of the electromagnetic signal in the circular waveguide 14 decays exponentially as the distance increases from the aperture 14a. An adjustable absorber 16 is positioned within the circular waveguide 14 to absorb some of the electromagnetic radiation that enters the circular waveguide 14 from the equalizer cavity 12. The position of the RF absorber 16 may be varied within the circular waveguide 14, by means of the screw-type arrangement 18 as shown or by any suitable conventional means. The RF absorber 16 comprises a dielectric absorber material. The RF absorber 16 is positioned within the circular waveguide 14 to absorb some of the electromagnetic energy and thereby lower the Qu of the equalizer cavity 12. Since the decay of the electromagnetic energy within the circular waveguide 14 is exponential, the amount of electromagnetic energy that is absorbed will depend primarily on the location of the RF absorber 16, and the diameter of the circular waveguide 14 and aperture 14a, rather than on the properties of the absorber 16 which might vary to some degree with time, temperature, and humidity.

The group delay of both filter and equalizer devices are related to their insertion loss in such a manner that when one is corrected, the other is automatically compensated. However, this holds true only if the unloaded Q of the equalizer resonators and filter cavities are equal. Some of the problems that are experienced in bandpass filters and equalizer cavities which effect amplitude flatness are as herein described. Small differences in the unloaded Q of the equalizer resonator can cause gain variation across the passband. The cascaded effect of the non-filter elements in the filter system can give unacceptable amplitude variations in some cases. The traveling wave tube amplifier adjustable equalizers are capable of only compensating for gross slope across the entire operating band of the traveling wave tube amplifier (decreasing gain with increasing frequency) where often they aggravated the gain slope of the traveling wave tube amplifier due to VSWR interaction with the hot input VSWR of traveling wave tube amplifier or gave the wrong slope for a particular channel. A cascaded array of five of the present equalizer cavity apparatus permits the phase equalizers to independently compensate for gain slope and for ripple up to 2.5 cycles per channel.

Figure 2:
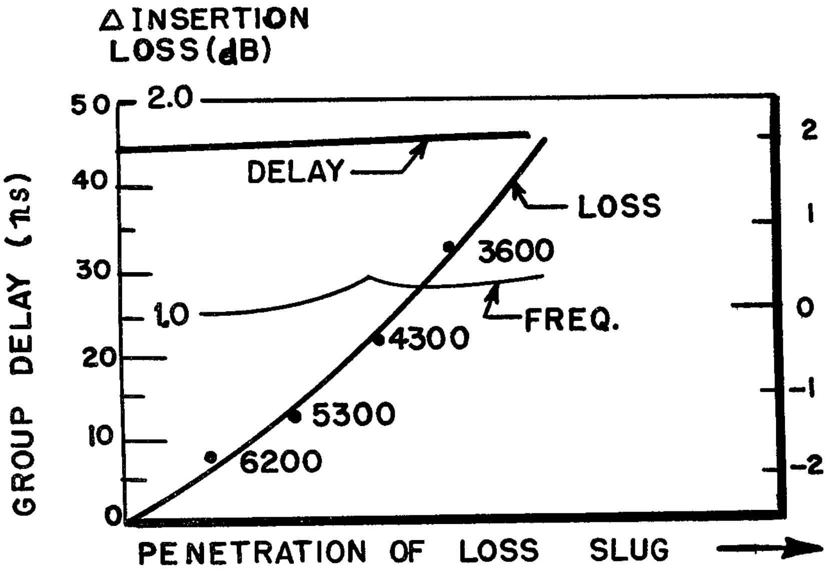

In FIG. 2, there is shown the measured performance characteristics for an equalizer cavity apparatus in which independent adjustment of loss is achieved without a significant effect on either the frequency or magnitude of the delay of the cavity. The change in resonant frequency observed is smaller than the resonator can be tuned and the delay change is insignificant. The total loss change achieved is four times the amount that would ever be needed. Because the hole is in the center of the top wall of the equalizer cavity, both orthogonal modes are effected equally. Since the waveguide is beyond cutoff and the volume is non-resonant, little detuning is experienced. In addition, the main coupling controlling the delay, is uneffected. The depth of absorber controls Qu due to interaction with exponentially decaying energy in the cutoff waveguide.

Although the invention has been described with reference to a particular embodiment, it will be understood to those skilled in the art that the invention is capable of a variety of alternative embodiments within the spirit and scope of the appended claims.

What is claimed is:

1. An equalizer cavity apparatus with independent amplitude control comprising in combination:

a rectangular waveguide for carrying an electromagnetic energy;

an equalizer cavity means mounted on the top surface of said rectangular waveguide, said equalizer cavity means being directionally coupled to said rectangular waveguide to receive a predetermined amount of said electromagnetic energy through an opening between said equalizer cavity means and said rectangular waveguide, and, a circular waveguide means positioned on the top surface of said equalizer cavity means, said equalizer cavity means including an aperture in its top surface to allow said electromagnetic energy therein to enter said circular waveguide means, said circular waveguide means including means for absorbing RF energy and means for positioning said RF absorber means within said circular waveguide means.

2. An equalizer cavity apparatus as described in claim 1 wherein said circular waveguide means is biased beyond cutoff.

3. An equalizer cavity apparatus as described in claim 1 wherein said aperture is centered in said top wall of said equalizer cavity means.

4. An equalizer cavity apparatus as described in claim 1 wherein said RF absorber means comprises a dielectric absorber material.

5. An equalizer cavity apparatus as described in claim 1 wherein said positioning means is adjustable.

6. An equalizer cavity apparatus as described in claim 2 wherein both orthogonal modes in said electromagnetic energy are reduced.

* * * * *